US011757032B2

(12) United States Patent
Germana-Carpineto (10) Patent No.: US 11,757,032 B2
(45) Date of Patent: Sep. 12, 2023

(54) TRANSISTOR STRUCTURE

(71) Applicant: STMicroelectronics (Rousset) SAS, Rousset (FR)

(72) Inventor: Rosalia Germana-Carpineto, Antibes (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 126 days.

(21) Appl. No.: 16/867,225

(22) Filed: May 5, 2020

(65) Prior Publication Data

US 2020/0381550 A1 Dec. 3, 2020

(30) Foreign Application Priority Data

May 28, 2019 (FR) ...................................... 1905661

(51) Int. Cl.
*H01L 29/78* (2006.01)
*H01L 29/423* (2006.01)
*H01L 29/66* (2006.01)

(52) U.S. Cl.
CPC ...... *H01L 29/7813* (2013.01); *H01L 29/4236* (2013.01); *H01L 29/66734* (2013.01)

(58) Field of Classification Search
None
See application file for complete search history.

(56) References Cited

U.S. PATENT DOCUMENTS

| 2005/0173758 A1 | 8/2005 | Peake et al. |
| 2013/0248998 A1 | 9/2013 | Misu et al. |
| 2013/0334601 A1 | 12/2013 | Dong et al. |
| 2016/0268423 A1* | 9/2016 | Koepp ................ H01L 29/7825 |
| 2017/0110545 A1* | 4/2017 | Nagao ................. H01L 29/0619 |
| 2017/0346476 A1 | 11/2017 | Xia et al. |
| 2017/0358650 A1 | 12/2017 | Meiser et al. |
| 2018/0145170 A1 | 5/2018 | Dix et al. |
| 2020/0006483 A1 | 1/2020 | Jovanov et al. |
| 2020/0381550 A1 | 12/2020 | Germana-Carpineto |

FOREIGN PATENT DOCUMENTS

| CN | 102184944 A | 9/2011 |
| CN | 102184944 B | 1/2013 |
| DE | 102004064308 B3 | 10/2018 |

OTHER PUBLICATIONS

Arif et al., "A comparative study on SOI MOSFETS for low power applications", Research Journal of Applied Sciences, Engineering and Technology Mar. 2013, pp. 2586-2591 (Year: 2013).*
Baliga, B. Jayant, "Advanced Power Rectifier Concepts," Springer, Jun. 16, 2009, 30 pages.

* cited by examiner

*Primary Examiner* — Vincent Wall (74) *Attorney, Agent, or Firm* — Slater Matsil, LLP (57) ABSTRACT

A transistor is disclosed. In an embodiment a transistor includes a first semiconductor region of a substrate, a first trench delimiting the first semiconductor region on a first side, a first electrically-conductive element located in the first trench, a channel area in contact with the first semiconductor region and a first area of contact with the first semiconductor region, wherein the channel area and the first area of contact are on the same surface side of the substrate.

17 Claims, 9 Drawing Sheets

TRANSISTOR STRUCTURE

CROSS-REFERENCE TO RELATED APPLICATIONS

This application claims priority to French Patent Application No. 1905661, filed on May 28, 2019, which application is hereby incorporated herein by reference.

TECHNICAL FIELD

The present disclosure generally concerns electronic devices and, more particularly, transistors.

BACKGROUND

In certain electronic devices, field-effect transistors, for example, of MOS type, are used in a non-conductive state to block high voltages, typically greater than 10 V, for example, in the order of 40 V, or even greater than 100 V. The smaller the transistor and/or the higher the voltage blocked in the non-conductive state, the higher the on-state resistance of the transistor.

SUMMARY

There is a need to improve the tradeoff between the on-state resistance, the dimensions, and the blocked off-state voltage in transistors.

An embodiment overcomes all or part of the disadvantages of known transistors.

An embodiment enables to decrease the on-state resistance and/or to decrease the occupied surface area and/or to increase the blocked voltage.

Thus, an embodiment provides a transistor comprising: a semiconductor region of a substrate, delimited by a trench; an electrically-conductive element located in the trench; a channel area in contact with said semiconductor region; and an area of contact with said region, the channel area and the area of contact being on the side of a same surface of the substrate.

According to an embodiment, a portion of the semiconductor region is located between the channel area and said area of contact.

According to an embodiment, the semiconductor region is delimited, on a side opposite to that of said trench, by an additional trench, and an additional electrically-conductive element is located in the additional trench.

According to an embodiment, a portion of the additional element is located opposite the channel area.

According to an embodiment, the transistor comprises a gate located in the trench.

According to an embodiment, the trench reaches a buried well.

According to an embodiment, a portion of the semiconductor region is located between the channel area and the buried well.

According to an embodiment, a portion of the conductive element is located opposite said portion of the semiconductor region.

According to an embodiment, the channel area reaches the buried well.

According to an embodiment, the transistor comprises, on one side of the channel area opposite to the semiconductor region, an additional semiconductor region in contact with the channel area, and an additional area of contact with said additional semiconductor region.

According to an embodiment, the transistor comprises another conductive element located in the trench opposite said additional semiconductor region.

According to an embodiment, the semiconductor region has, from the area of contact with said region, decreasing doping levels.

According to an embodiment, the transistor comprises a doped area covering a portion of the channel area, said doped area being preferably electrically coupled to the conductive element.

According to an embodiment, said doped area comprises a branch extending between the conductive element and an area of contact with the channel area.

An embodiment provides an electronic device comprising one or a plurality of transistors as described.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION OF ILLUSTRATIVE EMBODIMENTS

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, mask manufacturing steps, doping steps, and steps of manufacturing terminals on doped areas are not detailed, the described embodiments being compatible with such usual steps.

Throughout the present disclosure, the term "connected" is used to designate a direct electrical connection between circuit elements, whereas the term "coupled" is used to designate an electrical connection between circuit elements that may be direct, or may be via one or more intermediate elements.

In the following description, when reference is made to terms qualifying absolute positions, such as terms "top", "bottom", "left", "right", etc., or relative positions, such as terms "above", "under", "upper", "lower", etc., or to terms qualifying directions, such as terms "horizontal", "vertical", etc., it is referred to the orientation of the cross-section views.

The terms "about", "substantially", and "approximately" are used herein to designate a tolerance of plus or minus 10%, preferably of plus or minus 5%, of the value in question.

Figure 1A:
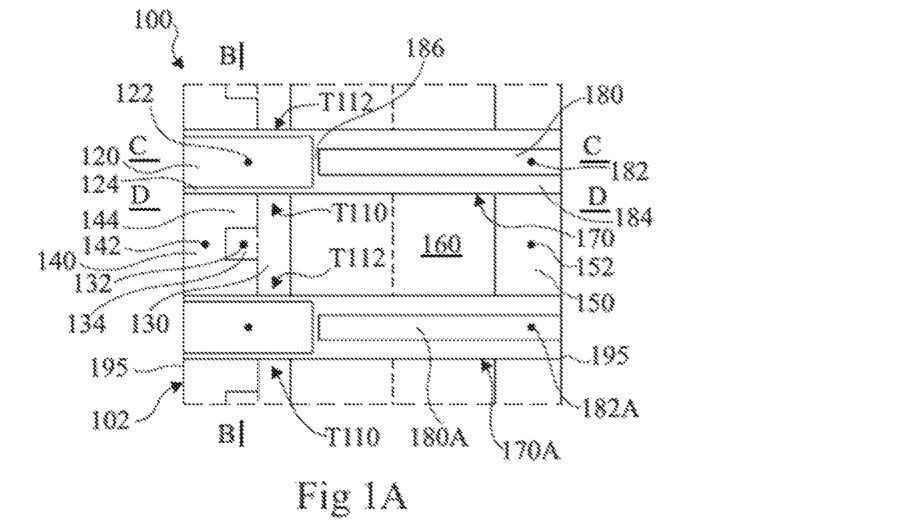
FIG. 1 partially and schematically shows a top view 1A and cross-section views 1B, 1C, and 1D of an embodiment of a device comprising a transistor.
Figure 1B:
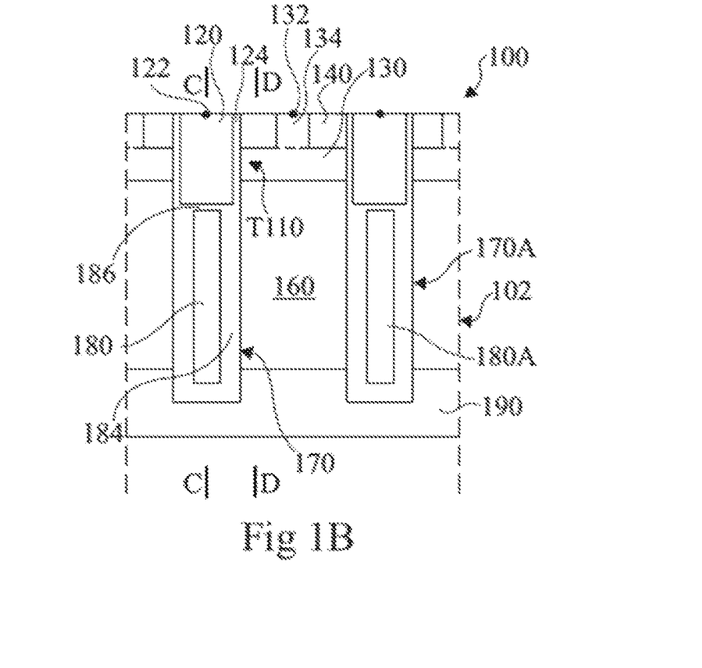
Figure 1C:
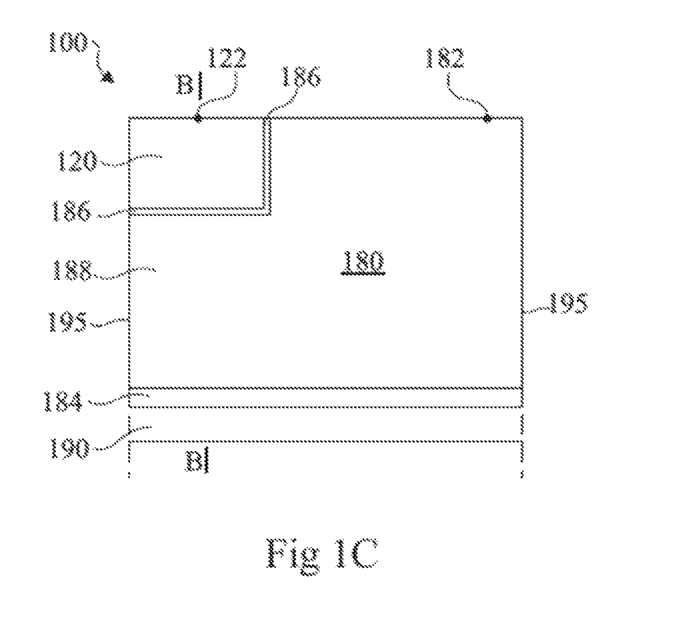
Figure 1D:
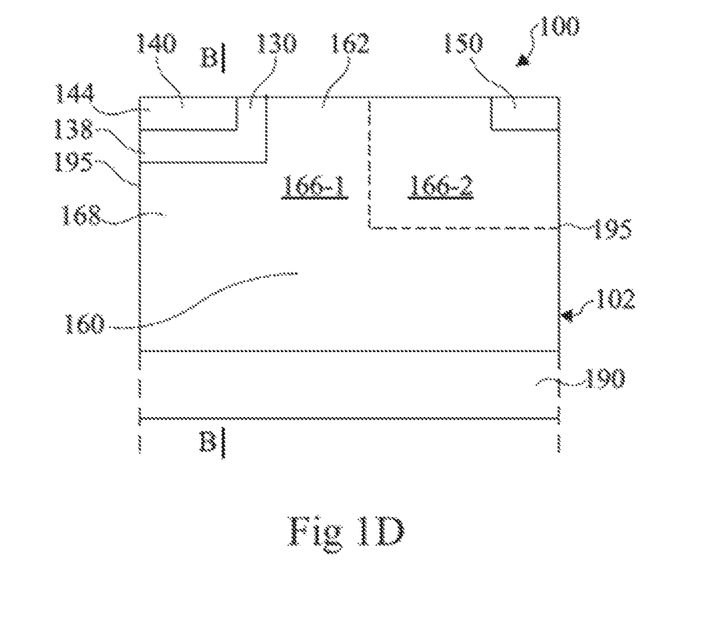
Figure 2:
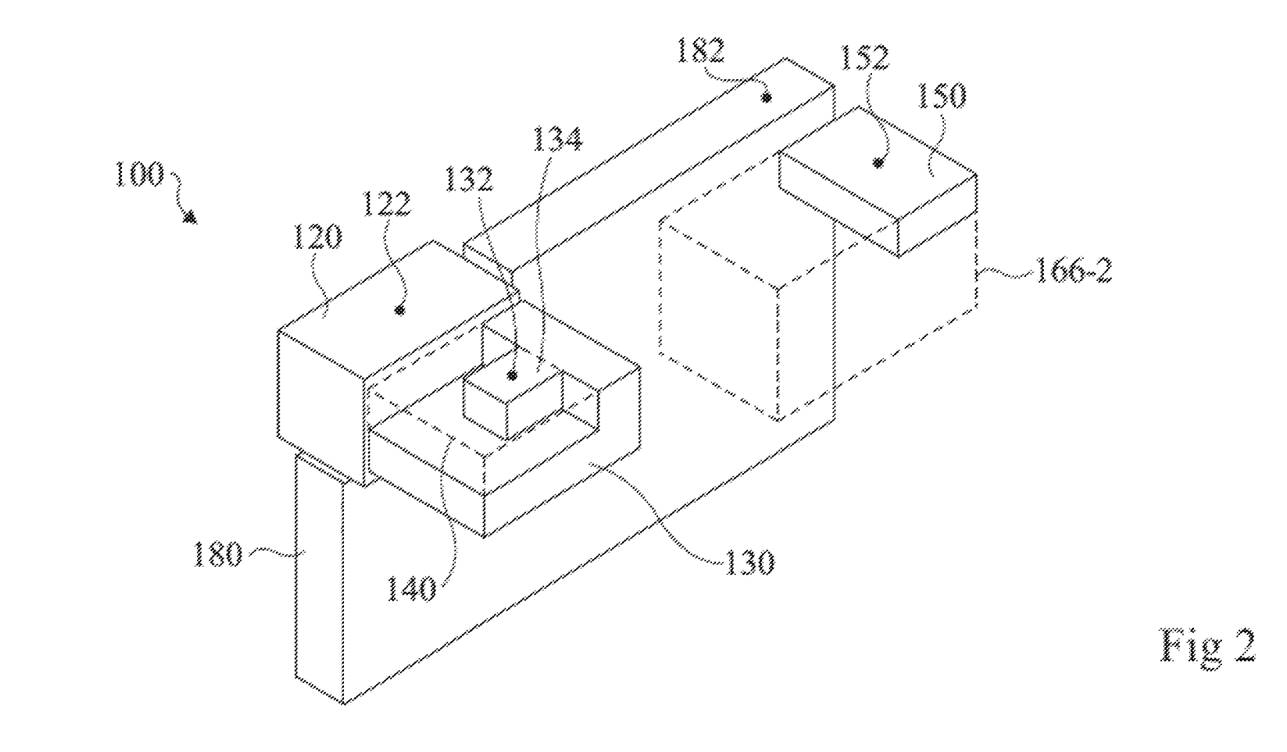
FIG. 2 partially and schematically shows a perspective view of the device of FIG. 1.
Figure 3A:
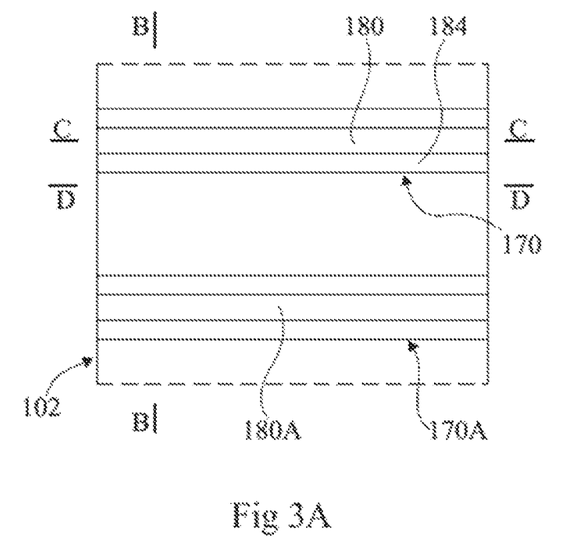
FIG. 3 partially and schematically shows a top view 3A and cross-section views 3B, 3C, and 3D, of a step of an example of a method of manufacturing the device of FIG. 1.
Figure 3B:
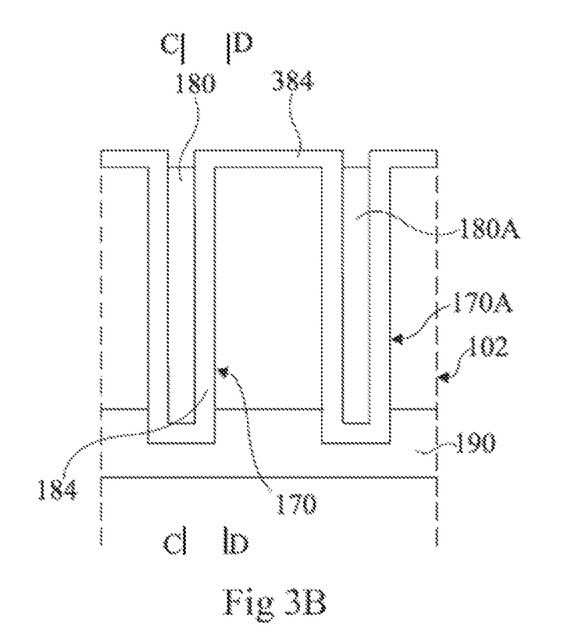
Figure 3C:
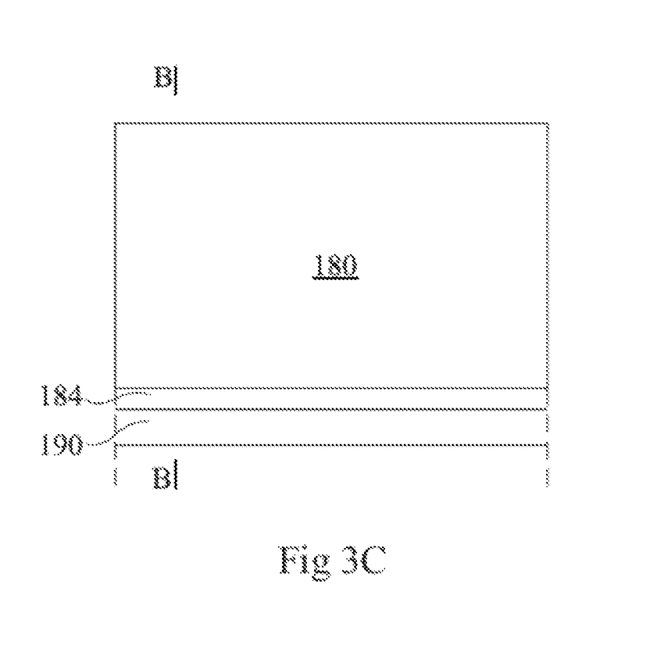
Figure 3D:
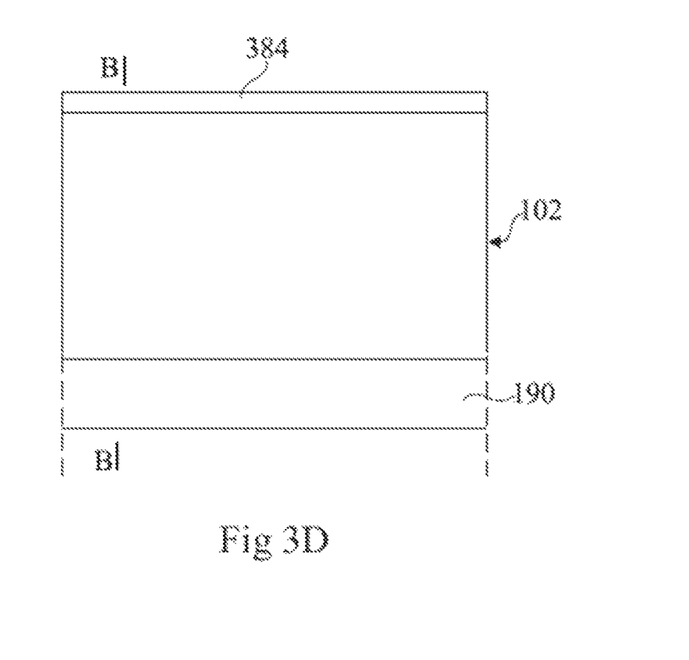
Figure 4A:
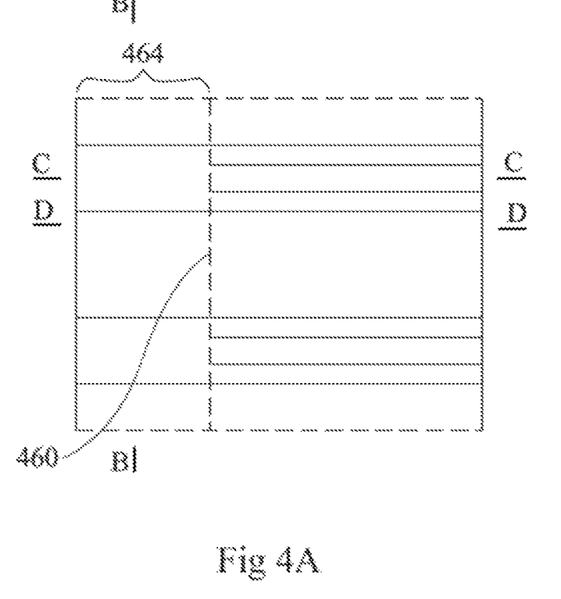
FIG. 4 partially and schematically shows a top view 4A and cross-section views 4B, 4C, and 4D of another step of the method.
Figure 4B:
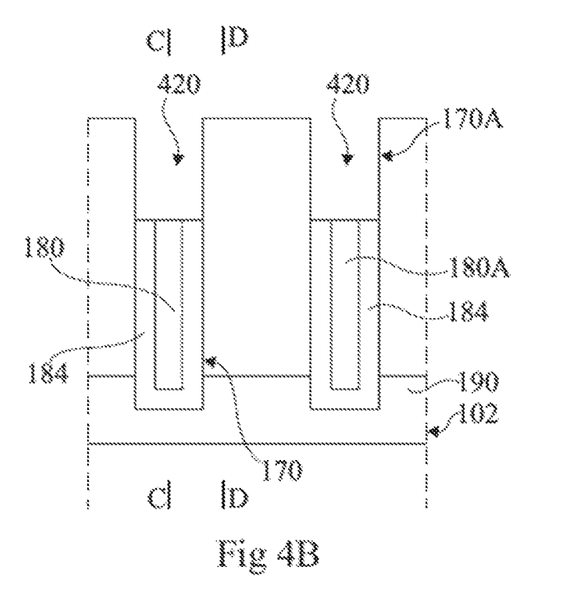
Figure 4C:
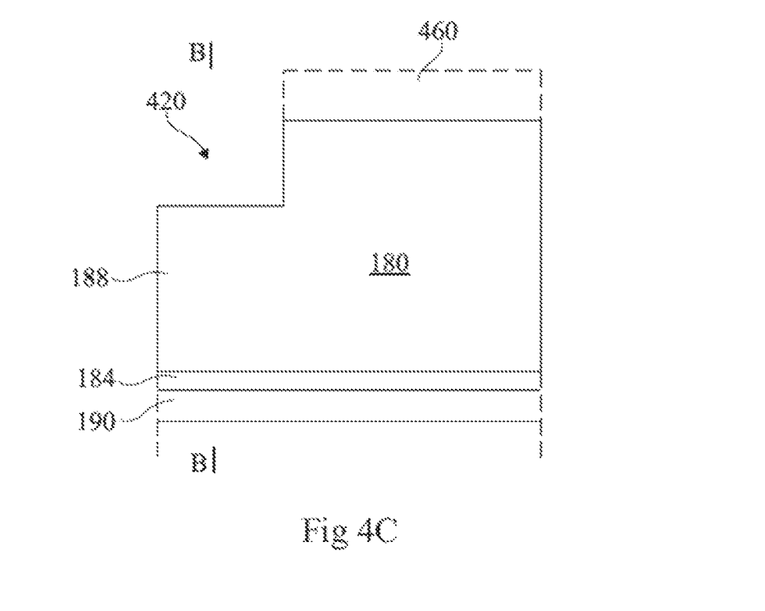
Figure 4D:
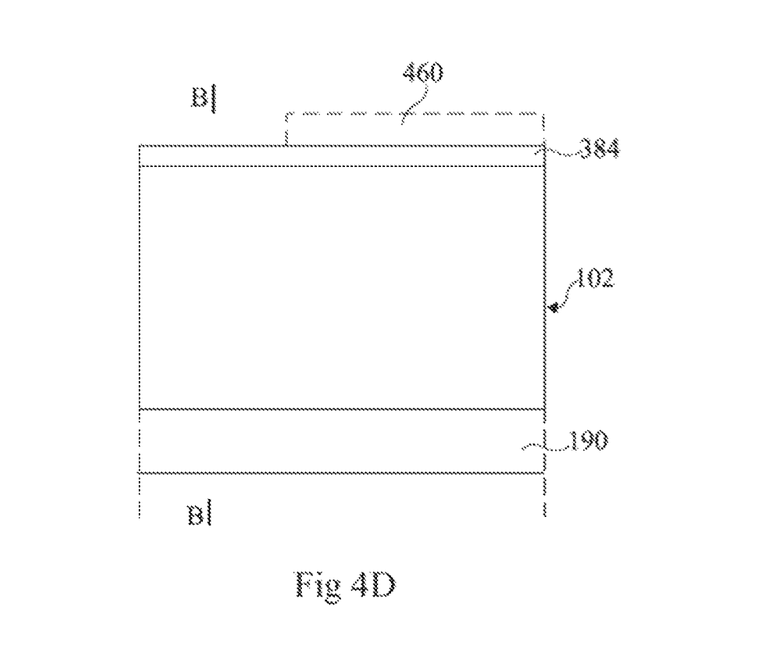

FIG. 1 partially and schematically shows a top view 1A and cross-section views 1B, 1C, and 1D, of an embodiment of a device 100 comprising a transistor. Cross-section views 1B, 1C, and 1D have respective cross-section planes B-B, C-C, D-D. FIG. 2 shows a partial simplified perspective view of device 100. In particular, electric insulators, a doped region, and a buried well are not shown in FIG. 2.

Device 100 is typically an electronic integrated circuit chip, defined by a semiconductor substrate 102 and elements, such as electronic components, located inside and on top of substrate 102.

In an example, substrate 102 is formed by a semiconductor wafer, for example, a silicon wafer. In another example, the substrate is formed by a layer located on the surface of a semiconductor wafer, for example, an epitaxial layer on a semiconductor wafer. Preferably, substrate 102 is a single-crystal substrate.

Among electronic components, device 100 comprises one or a plurality of transistors. In particular, device 100 comprises a field-effect transistor T110, or a plurality of transistors Tito electrically connected in parallel. Transistor T110 particularly comprises: a gate 120 connected to a control terminal 122 of the transistor; a channel area 130 separated from gate 120 by a gate insulator 124. Channel area 130 is preferably connected, via an area of contact 134, to a terminal 132, sometimes referred to as the body terminal of the transistor; and doped drain/source areas 140 and 150 located on either side of channel area 130 and in contact with respective terminals 142 and 152. According to an embodiment, doped area 140 covers a portion of channel area 130.

Transistor T110 is located on the side of a front surface (upper surface) of substrate 102. In particular, elements such as gate 120, channel area 130, and doped areas 140 and 150 are located on the front side of the substrate, that is, they each have, on the front surface side, a surface which is not covered with a portion of substrate 102. Thereby, terminals 132, 142, and 152 may be defined by conductors located on these elements, for example, vias crossing an insulating layer covering the device. The connections enabling to electrically couple transistor Tim to other components of the device or to an external device are then easier to form than if, for example, doped area 150 was located on the rear surface side.

Preferably, terminal 142, sometimes referred to as the conduction terminal, and terminal 132, sometimes referred to as the bulk terminal, are electrically coupled, preferably connected, to each other. Terminal 142 then corresponds to the source terminal of transistor T110 and terminal 152 corresponds to the drain terminal of transistor T110. Doped areas 140 and 150 then define respective drain and source areas. This is not limiting, and terminals 132 and 142 may for example not be coupled or connected to each other.

Gate 120 comprises at least one electric conductor such as, for example, a metal and/or doped polysilicon. Gate insulator 124 is in contact with channel area 130 and with an electric conductor of gate 120. Gate insulator 124 is typically formed of one or a plurality of dielectric layers, for example, the gate insulator is formed of a silicon oxide layer. The thickness of the gate insulator is typically smaller than 15 nm, preferably in the range from 3 to 10 nm.

As an example, transistor T110 is of N-channel type. Thus, doped areas 140 and 150 are N-type doped. Channel area 130 is P-type doped. However, in the described embodiments, the N and P conductivity types, or doping types, may be exchanged. Operations similar to those described are then obtained by exchanging the signs of the voltages in the device. Preferably, the doping levels of areas 140 and 150 are high, that is, greater than $5*10^{18}$ atoms/cm$^3$ and preferably greater than $10^{19}$ atoms/cm$^3$. Area 134 of contact with channel area 130 is a doped area also having such a high doping level. The doping level of channel area 130 is preferably smaller than $10^{18}$ atoms/cm$^3$, more preferably smaller than $5*10^{17}$ atoms/cm$^3$.

Transistor T110 further comprises a semiconductor region 160 (not shown in FIG. 2), called drift region. Semiconductor region 160 is insulated from doped area 140 by channel area 130. Semiconductor region 160 comprises at least a portion 162 (view 1D) located between channel area 130 and doped area 150. The distance separating channel area 130 from doped area 150 is for example in the range from 1 to 5 μm, preferably from 2 to 4 μm. Semiconductor region 160 has an N-type doping level smaller than that of N-type doped area 150. Preferably, semiconductor region 160 has a low doping level, that is, smaller than $2*10^{17}$ atoms/cm$^3$. This doping level is preferably greater than $5*10^{16}$ atoms/cm$^3$. Due to its doping level greater than that of semiconductor region 160, doped area 150 forms an area of electric contact with semiconductor region 160.

In the non-conductive state of the transistor, drift region 160, due to its low doping level, blocks a high voltage, such as mentioned as a preamble, between channel area 130 and area of contact 150. In the conductive state of the transistor, a current flowing through the transistor flows through drift region 160, from area of contact 150 to channel area 130.

Semiconductor region 160 is delimited by a trench 170. More particularly, trench 170 extends in substrate 102 from the front surface of substrate 102, and a wall of trench 170 forms a lateral surface of semiconductor region 160. Preferably, this wall of trench 170 also forms a surface of channel area 130. As an example, the trench has a width in the range from 100 to 500 nm.

Transistor T110 further comprises an electrically-conductive element 180 located in trench 170. Conductive element 180 is connected to a terminal 182. Terminal 182 is preferably connected to terminal 132. Conductive element 180 is located opposite at least a portion of semiconductor region 160, that is, conductive element 180 is located against an insulator 184 covering the lateral surface of at least a portion of semiconductor region 160. In particular, the conductive element is located opposite portion 162 located between channel area 130 and doped area 140. Preferably, conductive element 180 is located opposite the entire semiconductor region 160 or substantially the entire semiconductor region 160. Insulating layer 184 separates conductive element 180 from semiconductor region 160. The distance between conductive element 180 and semiconductor region 160, corresponding to the thickness of insulating layer 184, is for example in the range from 100 nm to 200 nm, preferably, in the range from 120 nm to 180 nm. Insulating layer 184 preferably has a thickness greater than that of gate insulator 124. As an example, insulating layer 184 is made of silicon oxide or of silicon nitride.

At the bottom of trench 170, an insulating portion, preferably a portion of layer 184, is located under conductive element 180. This portion electrically insulates conductive element 180 from the substrate portion located under conductive element 180. Further, insulating portions 186, preferably of same thickness and of same material(s) as gate insulator 124, electrically insulate conductive element 180 from gate 120.

Preferably, conductive element 180 is formed by a conductive wall located in a central portion of trench 170. The wall extends in the same direction as the trench. The wall extends in substrate 102 orthogonally to the front surface of the substrate. As an example, the wall comprises, preferably is made of, a metallic material or, preferably, doped polysilicon. The width of the conductive wall, taken in the width direction of the trench, is for example in the range from 30 nm to 200 nm.

In the non-conductive state of the transistor, conductive element 180 shields a portion of the electric field due to the voltage between channel area 130 and area of contact 150. The electric field at the level of the PN junction between channel area 130 and semiconductor region 160 is thus lower than if conductive element 180 was not provided. This increases the maximum voltage that the transistor can block.

In the absence of a conductive element 180, to increase the maximum voltage that the transistor can block, it could have been devised to decrease the doping of drift region 160 or to increase the distance between channel area 130 and drain area of contact 150. However, this would have increased the resistance of drift region 160, and thus the on-state resistance of the transistor. Conductive element 180 thus enables to increase the maximum voltage blocked by the transistor without increasing the on-state resistance of the transistor. Further, conductive element 180 enables to increase the doping level of drift region 160 and/or to reduce the distance between channel area 130 and drain area of contact 150, and thus to decrease the on-state resistance of the transistor, while keeping a maximum blocked voltage at least equal to that of transistors which do not comprise conductive element 180.

Preferably, semiconductor region 160 is delimited, on its side opposite to trench 170, by an additional trench 170A. Semiconductor region 160 is then located between trenches 170 and 170A. Additional trench 170A is parallel to trench 170, that is, trenches 170 and 170A have the same elongation direction. More preferably, additional trench 170A contains same elements as trench 170, arranged symmetrically with respect to semiconductor region 160, that is, an additional conductive element 180A symmetrical to conductive element 180 and located opposite at least a portion of semiconductor region 160. Conductive element 180A is in contact with a terminal 182A, preferably connected to terminal 182 of conductive element 180.

Additional conductive element 180A enables to improve the shielding allowed by conductive element 180. This results in an additional improvement of the maximum voltage blocked by the transistor and/or of the on-state resistance of the transistor.

Preferably, trench 170 delimits channel area 130. More particularly, the channel area then has a lateral surface formed by the wall of trench 170. More preferably, gate 120 is then located in trench 170 opposite channel area 130. Gate insulator 124 covers the corresponding portion of the wall of trench 170.

Due to the fact that the gate is in the trench, a conduction channel forms in the conductive state in channel area 130 against the lateral surface of channel area 130. As compared with a variation where gate 120 is arranged on channel area 130, it is avoided for the conduction channel to have as a width the distance between trenches 170 and 170A. Thus, the fact of providing gate 120 in trench 170 enables the shape of the conduction channel not to depend on the distance over which channel area 130 extends from trench 170. This distance can thus be decreased, for example, the trenches may be brought closer to one another, without modifying the shape of the conduction channel, for example, without decreasing its width, and thus without decreasing the current flowing through the transistor and without increasing the on-state resistance of the transistor. Thus, the surface area occupied by transistor T110 is, for a same current and a same on-state resistance, smaller than that of a transistor having its gate located on the channel area. As an example, the width of semiconductor region 160 in the trench width direction is in the range from 300 nm to 1 μm.

Conductive element 180 and gate 120 located in the trench result in that, in transistor T110 in the conductive state, the current flows through a portion of drift region 160 larger than in the absence of conductive element 180 and/or than if gate 120 was not located in the trench. In particular, the current flows through portions of drift region 160 more remote from the lateral surfaces of drift region 160 than in the absence of the conductive elements. The current also flows through portions of drift region 160 more remote from the upper surface of drift region 160 than if the gate was located on the channel area. This enables to decrease the on-state resistance of the transistor, in particular by decreasing various effects of the presence of the surfaces of drift region 160 on the mobility of charge carriers.

In a preferred example, semiconductor region 160 has, from area of contact 150, decreasing doping levels. In the shown example, semiconductor region 160 comprises two sub regions 166-1 and 166-2.

Sub-region 166-2 separates sub-region 166-1 from area of contact 150. Sub-region 166-2 extends from the area of contact to channel area 130, over a distance for example in the range from one third to two thirds, preferably substantially half, of the distance between area of contact 150 and channel area 130. Sub-region 166-2 extends from the area of contact to channel area 130 over a distance for example in the range from 0.5 μm to 1.5 μm, preferably in the order of 1 μm. The doping level of sub-region 166-2 is in the range from that of region 166-1 to that of area of contact 150. The doping level of sub-region 166-2 may be in the range from $10^{17}$ to $10^{18}$ atoms/cm$^3$.

This preferred example is not limiting, and semiconductor region 160 may comprise, or be formed by, a number N of semiconductor sub-regions 166-i, index i being in the range from 1 to N. Sub-region 166-N extends from area of contact 150. The sub-regions are placed in an order of decreasing index i from area of contact 150, the doping level of sub-region 166-i being an increasing function of index i. As a variation, semiconductor region 160 may have a doping level gradient from area of contact 150.

Sub-regions 166-i, for i different from 1, or the sub region having a doping level gradient, form an area having a doping level intermediate between that of sub-region 166-1 and that of area of contact 150. Such an area allows, for a given on-state resistance, a desired level of maximum voltage blocked by the transistor to be obtained. The fact for the doping level of semiconductor region 160 to decrease from area of contact 150 enables, for a same maximum voltage blocked by the transistor in the non-conductive state, to improve the on-state resistance of the transistor.

According to an embodiment, channel area 130 is located on semiconductor region 160, more particularly a portion 168 of semiconductor region 160 is located under channel area 130. In other words, channel area 130 is, as compared with portion 168, on the front surface side. A portion 188 of conductive element 180 is then preferably located under gate 120. Portion 188 of the conductive element is then located opposite portion 168 of semiconductor region 160.

An advantage of providing portion 168 of semiconductor region 160 is that, in the conductive state, the conduction channel of the transistor comprises a horizontal portion 138 in contact with portion 168, and the current originating from area of contact 150 may join portion 138 of the channel by flowing through portion 168 of semiconductor region 160. This results in a decrease of the on-state resistance.

According to another advantage, in device 100, transistors, not shown, which differ from transistor T110 comprising portion 168 of semiconductor region 160 in that area of contact 150 is omitted and replaced with a drain area of contact on the rear surface of the substrate, may further be provided. In such transistors, called vertical transistors, in the conductive state, the current flows vertically between the channel area and the drain area of contact. To manufacture, in the same device, transistor T110 comprising portion 168 of region 160 and the vertical transistors, it is possible to implement steps of simultaneous manufacturing of transistor T110 and of the vertical transistors. A device comprising both vertical transistors and transistors T110 is then particularly simple to manufacture.

Preferably, doped area 140 has a branch 144 that extends between area 134 of contact with the channel area, and conductive element 180. This enables, for a given size of area of contact 134, to decrease the length of the conductive channel between doped area 140 and semiconductor region 160. The on-state resistance is thus decreased.

Preferably, trenches 170 and 170A reach a buried well 190, that is, a region having a conductivity type (here, type P) opposite to that of substrate 102 (here, of type N) covering a portion of the substrate and covered with regions of the same conductivity type as that of the substrate. In other words, the trenches extend from the front surface of substrate 102 to buried well 190. The possible portion 168 of semiconductor region 160 is thus located between channel area 130 and buried well 190. Buried well 190 can be biased to a potential smaller than that of semiconductor region 160. For this purpose, buried well 190 is for example coupled to ground (not shown). The buried well thus enables to electrically insulate semiconductor region 160 from the rest of substrate 102. Transistor T110 may thus be insulated from other components of the device, for example, other transistors.

Preferably, device 100 comprises a plurality of transistors T110, more preferably repeated in an array. Thus, the transistors are repeated, in the shown example, in a first direction parallel to the front surface, for example, the column direction of the array, the first direction being in this example orthogonal to the elongation direction of trenches 170 and 170A.

Preferably, device 100 comprises transistors T112 interposed between neighboring transistors T110 repeated in the first direction, that is, a column comprises alternately repeated transistors T110 and T112. Transistors T112 are symmetrical to transistors T110 with respect to a plane orthogonal to the first direction. In the shown example, each trench 170 is common to one of the transistors Tito and one of the transistors T112 arranged symmetrically on either side of the trench, gate 120 and conductive element 180 being common to the two transistors. In this example, semiconductor region 160, channel area 130, and doped areas 140 and 150 are common to one of transistors T110 and one of transistors T112 arranged symmetrically on either side of semiconductor region 160 and, for each of the two transistors, the trench 170 of one of the two transistors corresponds to the additional trench 170A of the other one of the two transistors.

Transistors T110 and, preferably, transistors T112, are also repeated (repetition not shown) in a second direction parallel to the front surface and orthogonal to the first direction, for example, the row direction of the array. The second direction here corresponds to the right-left direction of views 1A, 1C, and 1D. Preferably, the columns close to the array are symmetrical with respect to a plane to the row direction. Semiconductor regions 160 may optionally be delimited by trenches extending along the column direction (trench wall 195). As a variation, the transistors are repeated only in the first direction or only in the second direction. This is not limiting, and the device may comprise a plurality of transistors arranged differently, or one or a plurality of pairs of transistors T110 and T112 between two trenches 170, 170A.

In a preferred example, terminals 132, 142, 152, and 182 are common to transistors T110 and/or T112. Thus, transistors T110 and/or T112 are electrically in parallel and are controlled in parallel, which enables to conduct high currents, that is, of more than 1 A, for example, of more than 5 A, or even of more than 50 A through the series association of the transistors in parallel. Such an association corresponds to a transistor formed of elementary transistors T110 and/or T112. The possible buried well 190 is preferably common to transistors T110 and/or T112.

Thus, the transistor formed of elementary transistors T110 and/or T112 enables high currents to flow and enables, as mentioned, to improve the tradeoff between the maximum blocked voltage and the on-state resistance. This is obtained for a relatively small substrate surface area occupied by the formed transistor, for example, the obtained formed transistor may have, for a maximum blocked voltage in the order of 44 V, an on-state resistance smaller than 17 m$\Omega$/mm$^2$.

FIGS. 3 and 4 partially and schematically illustrate steps of an example of a method of manufacturing device 100 of FIG. 1. More particularly, FIG. 3 shows a top view 3A and cross-section views 3B, 3C, and 3D at a same step, and FIG. 4 shows a top view 4A and cross-section views 4B, 4C, and 4D at another step. The cross-section planes are respectively the same as those of FIG. 1.

At the step of FIG. 3, substrate 102 is provided. Optionally, buried well 190 is formed. Buried well 190 may be formed at this step or at a subsequent step of the method.

Trenches 170, 170A are then etched in the substrate, preferably down to a level located in the buried well. After this, an electrically-insulating layer 384 having portions which will form the future insulating layers 184 of the transistors are formed on the walls and the bottom of the trenches. As an example, the layer is obtained by a conformal deposition covering the structure resulting from the etching of the trenches. Insulating layer 384 is preferably made of silicon oxide. The thickness of insulating layer 384 is smaller than the half-width of the trenches, to leave an unfilled space in the central portion of the trenches.

Then, the remaining space of the trenches is filled, preferably with doped polysilicon. This results in conductive elements 180, 180A. As an example, the entire structure resulting from the deposition of the insulating layer is covered with polysilicon and the polysilicon located above a given level is removed by etching. This given level is preferably that of the front surface of the substrate, or is located at a height smaller than 10 nm above the front surface of the substrate. This results in conductive walls 180, 180A located in the trenches.

At the step of FIG. 4, at locations 420 of gates 120 and of gate insulators 124, the portions of insulating layer 384 and of the conductive material of elements 180 are removed.

Preferably, for this purpose, a mask 460 (shown in dotted lines) leaving access to a portion 464 of the upper surface of the structure has previously been formed. Portion 464 has in top view a strip shape having its main direction, or elongation direction, orthogonal to the trench elongation direction. The portions of the conductive material of elements 180 located in strip 464 are etched selectively over insulating layer 384 down to the upper level of portions 188 of conductive elements 180. Insulating layer 384 protects the substrate during the etching of the conductive material. The portions of insulating layer 384 made accessible by the etching of the conductive material are then etched selectively over substrate 102.

At a subsequent step, not shown, the gate insulator is formed on the walls of trenches 170 accessible in strip 464. Insulating portions 186 intended to insulate the conductive element 180 of the future gates 120 are formed, preferably simultaneously with the gate insulator. This may be obtained by a thermal oxidation. Gates 120 are then formed. Channel area 130, doped areas 134, 140, 150 and sub-regions 166-$i$ may be formed by doping of substrate 102 before or after the above-described steps. After this, terminals 122, 132, 142, 152, and 182 are formed.

Figure 5:
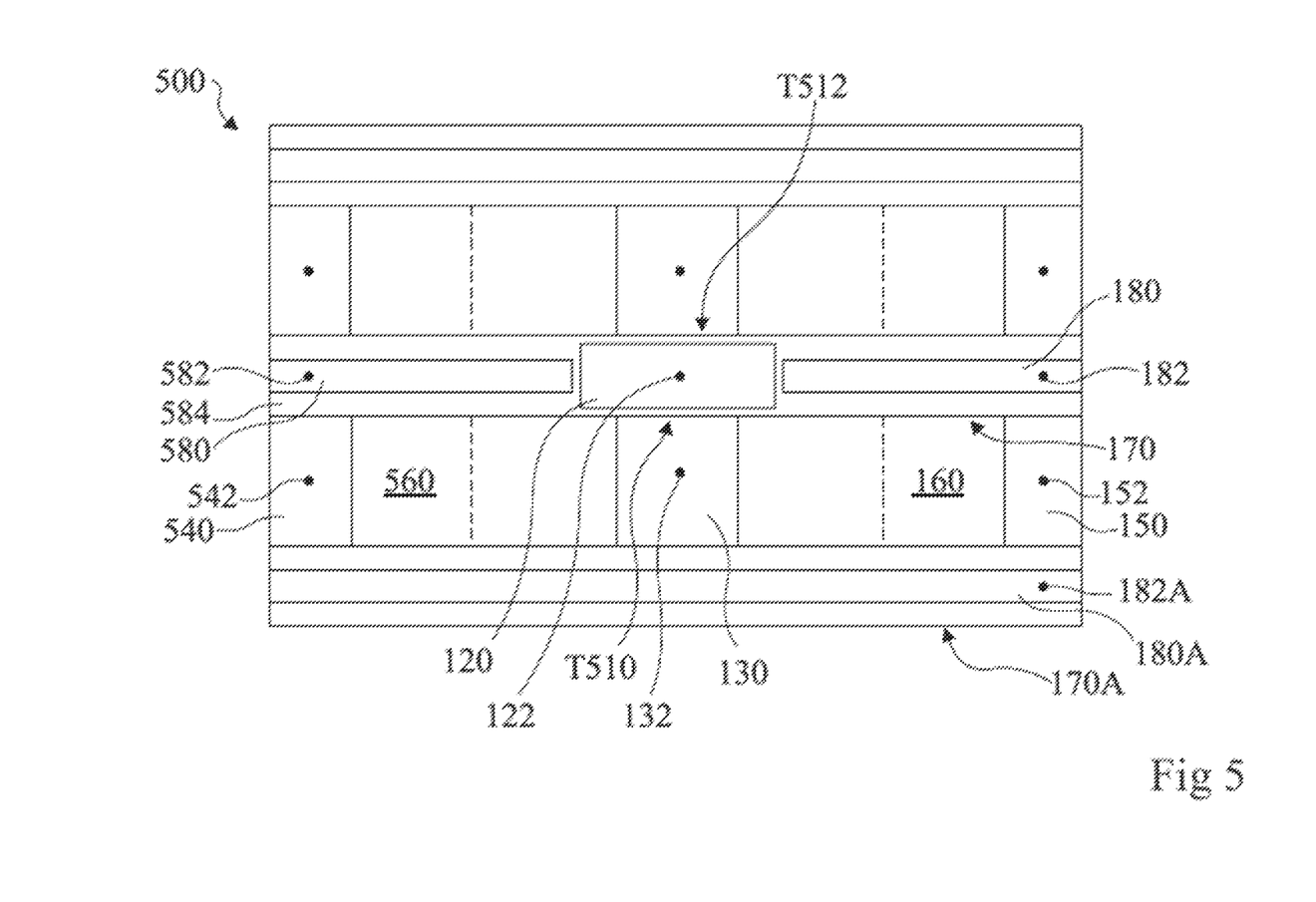
FIG. 5 partially and schematically shows a top view of another embodiment of a device comprising a transistor.
Figure 6:
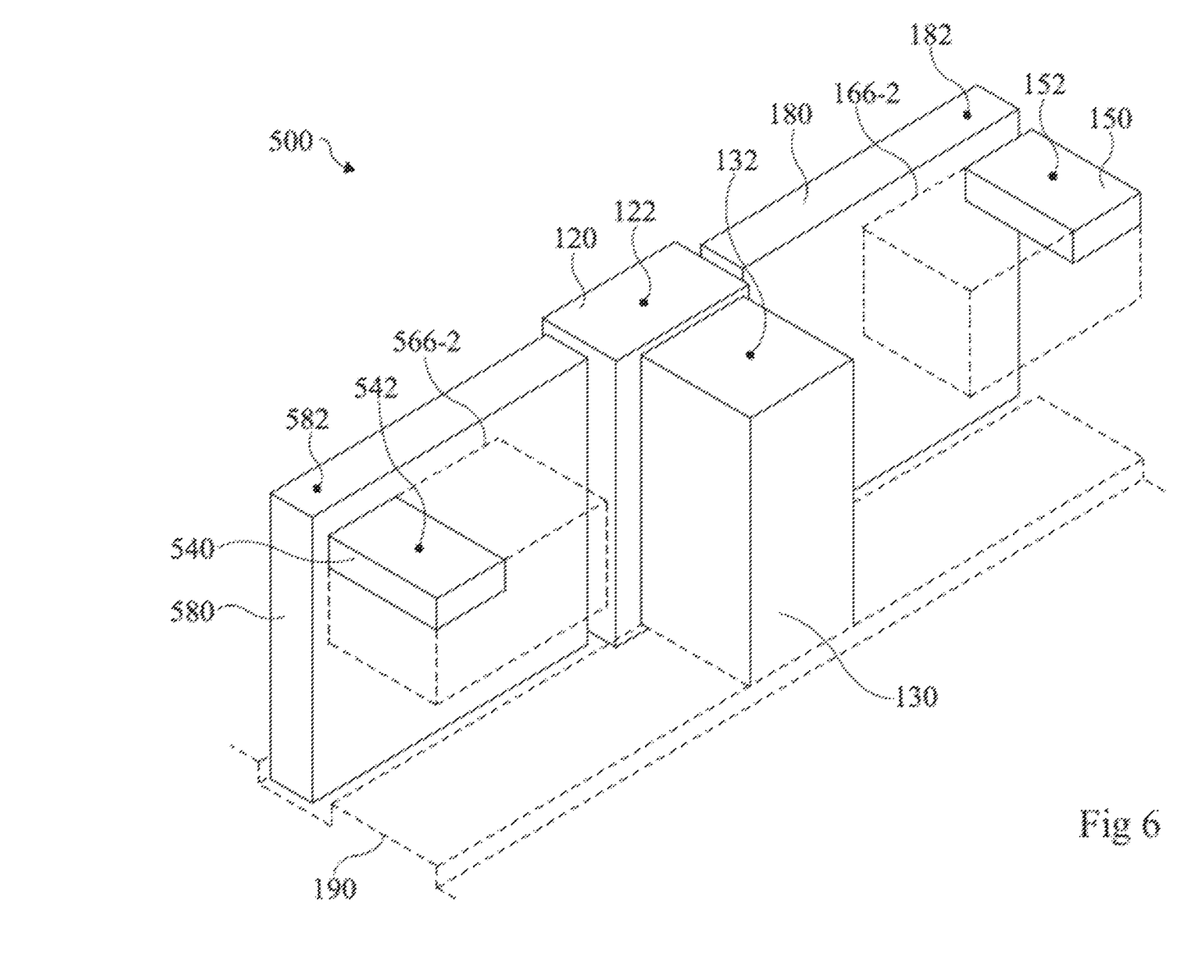
FIG. 6 partially and schematically shows a perspective view of the device of FIG. 5.

FIGS. 5 and 6 are respectively a cross-section view and a partial perspective view, schematically showing an embodiment of a device 500 comprising one or a plurality of transistors and, in particular, a transistor T510. Device 500 comprises elements identical or similar to those of device 100 of FIGS. 1 and 2, arranged identically or similarly. These elements are not described again in detail, and only the different are highlighted herein.

Transistor T510 differs from transistor Tito of device 100 of FIGS. 1 and 2 in that a channel area 130 extends from the front surface of substrate 102 to buried well 190, that is, it reaches the buried well. Semiconductor region 160 is thus deprived of portion 168 located under the channel area; a device 500 comprises a semiconductor region 560 in contact with channel area 130 and located on the side of channel area 130 opposite to semiconductor region 160. Due to the fact that the channel area reaches the buried well, semiconductor regions 160 and 560 are electrically insulated from one another in the blocked state; and an N-type doped area 140 is replaced with an N-type doped area 540, having a high doping level so that doped area 540 forms an area of electric contact with region 560. Area of contact 540 is connected to a terminal 542, preferably connected to terminal 132 of the transistor.

Preferably, conductive element 180 comprises no portion 188 located under gate 120. More preferably, transistor T510 then comprises a conductive element 580 arranged in trench 170 on the side of gate 120 opposite to conductive element 180. Conductive element 580 is located opposite at least a portion of semiconductor region 560, that is, located against an insulating layer 584 located against semiconductor region 560. Conductive element 580 is connected to a terminal 582, preferably connected to terminal 182 of conductive element 180. As a variation, conductive element 180 may comprise portion 188 located under gate 120 and be continued by a portion 580 located in trench 170 opposite semiconductor region 560.

Preferably, transistor T510 has a plane of symmetry orthogonal to the elongation direction of the trenches, the plane of symmetry running through gate 120 and channel area 130. In particular, conductive element 580, region 560, and area of contact 540 are symmetrical respectively to conductive element 180, to semiconductor region 160, and to doped area 150 with respect to the plane of symmetry.

In the preferred case where transistor T510 comprises a trench 170A and a conductive element 180A located in trench 170A, conductive element 180A extends in trench 170A more preferably opposite semiconductor region 160, channel area 130, and semiconductor region 560. In other words, trench 170 does not contain the gate of another transistor.

In an example, the doping level is substantially uniform in each of semiconductor regions 160 and 560, the doping levels of these regions being for example equal. In another example, the doping of semiconductor regions 160 and 560 decreases from respective areas of contact 150 and 540. Semiconductor regions 160 and 560 may then comprise for example respectively sub-regions 166-2 and 566-2 located against respective areas of contact 150 and 540, the sub-regions having a doping level intermediate between that of the rest of regions 160, 560 and that of areas of contact 150 and 540.

The structure of transistor T510 enables, as mentioned in the case of transistor T110, to optimize the tradeoff between the maximum voltage in the off state, the on-state resistance, and the substrate surface area (top view) occupied by the transistor.

Preferably, device 500 further comprises a transistor T512 symmetrical with respect to trench 170 to transistor T510, trench 170, gate boo, and conductive elements 180 and 580 being common to transistors T510 and T512.

Preferably, transistors T510 and T512 are connected in parallel and have their control terminals 122 coupled together, preferably connected together.

Various embodiments and variations have been described. It will be understood by those skilled in the art that certain features of these various embodiments and variations may be combined, and other variations will occur to those skilled in the art.

Finally, the practical implementation of the described embodiments and variations is within the abilities of those skilled in the art based on the functional indications given here above.

What is claimed is:

1. A transistor comprising:
a first drift region of a substrate;
a first source/drain region disposed in the first drift region;
a second source/drain region disposed in the first drift region and spaced from the first source/drain region;
a first trench extending from the first source/drain region to the second source/drain region along on a first side of the first drift region;
a first electrically-conductive element located in the first trench;
a gate electrode located in the first trench adjacent the first electrically-conductive element; and
a channel area adjacent the gate electrode and the first source/drain region and in contact with the first drift region, wherein the channel area and the second source/drain region are on the same surface side of the substrate.

2. The transistor of claim 1, further comprising:
a second trench extending along a second side of the first drift region, the second side opposite to the first side; and
a second electrically-conductive element located in the second trench.

3. The transistor of claim 2, wherein a portion of the second electrically-conductive element is located opposite the channel area.

4. The transistor of claim 1, further comprising a buried well spaced from the surface side of the substrate by the first drift region, wherein the first trench reaches well buried well.

5. The transistor of claim 4, wherein a second portion of the first drift region is located between the channel area and the buried well.

6. The transistor of claim 5, wherein a portion of the first electrically-conductive element is located opposite the second portion of the first drift region.

7. The transistor of claim 1, wherein a portion of the first drift region closer to the second source/drain region has a higher doping level than a portion of the first drift region further from the second source/drain region.

8. The transistor of claim 1, wherein the first source/drain region covers a portion of the channel area.

9. The transistor of claim 8, wherein the first source/drain region comprises a branch extending between the first trench and a channel contact area of the channel area.

10. An electronic device comprising:
a plurality of transistors of claim 1.

11. A transistor comprising:
a first drift region of a substrate;
a first source/drain area disposed in the first drift region;
a second source/drain area disposed in the first drift region and laterally spaced from the first source/drain area;
a first trench extending from the first source/drain area to the second source/drain area along a first side of the first drift region;
a first electrically-conductive element located in the first trench;
a first gate located in the first trench;
a second trench extending from the first source/drain area to the second source/drain area along a second side of the first drift region, the second side opposite to the first side;
a second electrically-conductive element located in the second trench;
a second gate located in the second trench;
a channel area in contact with the first drift region and located between the first trench and the second trench; and
a channel contact area contacting the channel area;
wherein the first source/drain area comprises a branch between the first trench and the second trench located on a front surface side of the substrate, the branch partially surrounds the channel contact area and is located above the channel area; and
wherein the second source/drain area is located on the same front surface side of the substrate.

12. The transistor according to claim 11, wherein the first and second trenches reach a buried well located on a rear surface side of the substrate.

13. A transistor comprising:
a first drift region of a substrate;
a first trench extending in a current flowing direction and delimiting the first drift region on a first side;
a first electrically-conductive element located in the first trench;
a gate electrode located in the first trench;
a first source/drain region adjacent the gate electrode in a direction perpendicular to the current flowing direction;
a channel area between and in contact with both the first drift region and the first source/drain region; and
a second source/drain region spaced from the channel area in by the first drift region in the current flowing direction;
wherein the first trench extends from the first source/drain region to the second source/drain region;
wherein the first drift region between the channel area and the second source/drain region is subdivided into a plurality of sub-regions;
wherein a sub-region closest to the channel area has a lower doping concentration than a sub-region closest to the second source/drain region; and
wherein the channel area and the second source/drain region are on the same surface side of the substrate.

14. The transistor of claim 13, further comprising:
a second trench extending in the current flowing direction and delimiting the first drift region on a second side opposite to the first side; and
a second electrically-conductive element located in the second trench.

15. The transistor of claim 13, further comprising a buried well spaced from the surface side of the substrate by the first drift region, wherein the first trench reaches the buried well.

16. The transistor of claim 15, wherein a second portion of the first drift region is located between the channel area and the buried well.

17. The transistor of claim 16, wherein a portion of the first electrically-conductive element is located opposite the second portion of the first drift region.

* * * * *